(12) United States Patent
Ogura et al.

(10) Patent No.: US 6,399,441 B1
(45) Date of Patent: Jun. 4, 2002

(54) NONVOLATILE MEMORY CELL, METHOD OF PROGRAMMING THE SAME AND NONVOLATILE MEMORY ARRAY

(75) Inventors: Seiki Ogura, Wappingers Falls, NY (US); Yutaka Hayashi, Tsukuba (JP)

(73) Assignee: Halo LSI Device & Design Technology, Inc., Wappingers Falls, NY (US)

( * ) Notice: Subject to any disclaimer, the term of this patent is extended or adjusted under 35 U.S.C. 154(b) by 0 days.

(21) Appl. No.: 09/861,489

(22) Filed: May 21, 2001

Related U.S. Application Data

(62) Division of application No. 09/473,031, filed on Dec. 28, 1999, now Pat. No. 6,255,166
(60) Provisional application No. 60/147,258, filed on Aug. 5, 1999.

(51) Int. Cl.$^7$ ............................................. H01L 21/336
(52) U.S. Cl. ..................... 438/257; 438/300; 438/350; 365/53; 365/185; 365/218
(58) Field of Search ................................ 438/257, 300, 438/350; 365/218, 185, 53

(56) References Cited

U.S. PATENT DOCUMENTS

| | | | |
|---|---|---|---|
| 5,408,115 A | 4/1995 | Chang | 257/324 |
| 5,768,192 A | 6/1998 | Eitan | 365/185.24 |
| 5,969,383 A | 10/1999 | Chang et al. | 257/316 |
| 6,011,725 A | 1/2000 | Eitan | 365/185.33 |
| 6,255,166 B1 * | 7/2001 | Ogura et al. | 438/257 |

OTHER PUBLICATIONS

F.L. Hampton et al., "Space Charge Distributing Limitation on Scale Down of MNOS Memory Devices", 1979 IEDM Technical Digest, pp. 374–377.
E. Suzuki et al., "A Low–Voltage Atterable EEPROM with Metal–Oxide–Nitride–Oxide–Semiconductor (MONOS) Structures", IEEE Transaction on Electron Devices, vol. ED–3D, Feb. 1983, pp. 122–128.

(List continued on next page.)

*Primary Examiner*—Vu A. Le
*Assistant Examiner*—Pho M. Luu
(74) *Attorney, Agent, or Firm*—George O. Saile; Stephen B. Ackerman; Rosemary L. S. Pike

(57) ABSTRACT

Provided in the present invention are a high speed and low program voltage nonvolatile memory cell, a programming method for same and a nonvolatile memory array. A nonvolatile memory cell comprises a first gate insulator formed on a surface of a first channel forming semiconductor region adjacent to a source region; a second gate insulator formed on a surface of a second channel forming semiconductor region adjacent to a drain region; a first gate electrode formed on said first gate insulator; and a second gate electrode formed on said second gate insulator wherein the second gate insulator includes a first layer forming a potential barrier at the interface with the second channel forming region; a third layer forming a potential barrier at the interface with the second gate electrode and the second layer between the first and third layers forming a carrier trapping level.

52 Claims, 9 Drawing Sheets

OTHER PUBLICATIONS

Takaaki Nozaki et al., "A 1–Mb EEPROM with MONOS Memory Cell for Semiconductor Disk Application", IEEE Journal of Solid–State Circuits, vol. 26, No. 4, Apr., 1991, pp. 497–501.

M. Kamiya et al., "EPROM Cell with High Gate Injection Efficiency", 1982 IEDM Technical Digest, 30.4, pp. 741–744.

S. Lai, "Nikke; Microdevice", Apr. 1967 Publication, pp. 70–81 –Large Capacity Flush Memory.

S. Ogura et al., "Low Voltage, Low Current, High Speed Program Step Split Gate Cell with Ballistic Direct Injection for EEPROM/Flash", 1998 IDEM, Technical Digest, 36.5, p. 987.

Boaz Eitan et al., "Can NROM, a 2 Bit, Trapping Storage NVM Cell, Give a Real Challenge to Floating Gate Cell?", 1999 International Conference on Solid State Devices and Materials, Session C–11–1, Tokyo, 1999, Extended Abstract Book, pp. 522–523.

T–Y. Chan et al., "A True Single–Transistor Oxide–Nitride–Oxide EEPROM Device", IEEE Electron Device Letters, vol. EDL–8, No. 3, Mar. 1987.

Kuo–Tang Chang et al., "A New SONOS Memory Using Source–Side Injection for Programming", IEEE Electron Device Letters, vol. 19, No. 7, Jul., 1998.

Wei–Ming Chen, "A Novel Flash Memory Device with SPLIT Gate Source Side Injection and ONO Charge Storage Stack (SPIN)".

Toku–kai–hei 11–74289 (Priority: Jun. 17, 1997) Inventors(s): Kou–Tung Chang et al., application Motorola.

Toku–Kai–Hei 10–247694 (Priority: Jun. 4, 1996), Inventor(s): Hiroaki Nakamura et al., Applicant: Sony.

* cited by examiner

NONVOLATILE MEMORY CELL, METHOD OF PROGRAMMING THE SAME AND NONVOLATILE MEMORY ARRAY

This is a division of patent application Ser. No. 09/473,031, filing date Dec. 28, 1999 now U.S. Pat. No. 6,255,166 Nonvolatile Memory Cell, Method Of Programming The Same And Nonvolatile Memory Array, assigned to the same assignee as the present invention.

This application claims priority from provisional application Ser. No. 60/147,758, filed Aug. 5, 1999.

BACKGROUND OF THE INVENTION

1. Field of the Invention

The present invention relates to a nonvolatile memory cell, a method of programming the same and non volatile memory array and more particularly to the nonvolatile memory cell enabling low voltage programming and/or high speed programming, a method of programming same and nonvolatile memory array.

2. Description of the Related Art

A MNOS memory is one of typical semiconductor memories wherein carrier charge is stored in a gate insulator to have information nonvolatilely stored. The MNOS memory is of a laminated structure comprising a conductive gate (M), a silicon nitride film (N), a tunnel oxide film (O) and a semiconductor wherein the carrier (electron or hole) is captured at a trapping level in the silicon nitride film to store the carrier charge. In this step, the silicon nitride film of the MNOS memory was required to be more than 19 nm in thickness since the charge trapping efficiency depended on the carrier capture distance in the silicon nitride film as described in F. L. Hampton and J. R. Cricchi "Space Charge Distribution Limitation of Scale Down of MNOS Devices", 1979 IEDM Technical Digest, p. 374. To program (write or erase) the MNOS memory, at least more than 10V or about 20V as a normal value of programming voltage was required for a electric field to be fed to a semiconductor surface via the silicon nitride film so that a carrier may be injected in the nitride film through (via a tunnel) the tunnel oxide film.

A MONOS memory is disclosed as the nonvolatile memory capable of reducing the programming voltage by E. Suzuki, H. Hiraishi, K. Ishii and Y. Hayashi, "A Low-Voltage Alterable EEPROM with Metal-Oxide-nitride-Oxide and semiconductor (MONOS) Structures", in IEEE Transaction on Electron Devices, Vol. ED-30, February 1983, p. 122). This MONOS memory is of a laminated structure comprising a conductive gate (M), a top oxide film (O), a silicon nitride film (N), a tunnel oxide film (O) and semiconductor. This structure has enabled the MONOS memory to stop hopping via the carrier trapping level in the silicon nitride film due to a potential barrier formed between the nitride film and the top oxide film, which resulted in making the nitride film as thin as possible. Further, carrier traps newly generated at the interface between the top oxide film and nitride film has enlarged a memory window to the extent it is possible to identify the stored information even if the entire insulator thickness is made thinner. This MONOS memory has made it possible to reduce the programming voltage down to 9V with the usable programming speed (0.1 msec) under the condition that the stored information is maintained for ten years as indicated in T. Nozaki, T. Tanaka, Y. Kijiya, E. Kinoshita, T. Tsuchiya and Y. Hayashi, "A1-Mb EEPROM with MONOS Memory Cell for Semiconductor Disk Application", IEEE Journal of Solid-State Circuits, Vol. 26, No. 4, April, 1991, p.497).

It has yet to be disclosed, however, whether or not it is possible to reduce programming voltage to be less than 9V under the condition that the programming speed is less than 0.1 msec and memory retention characteristics is maintained. To achieve the programming voltage of less than 9V, either programming speed or memory storage characteristics or both were required to be sacrificed. On the other hand, PAC (perpendicularly accelerated channel) injection is disclosed as a method to improve the injection efficiency to the gate insulator with the programming voltage being lowered as seen in M. Kamiya, Y. Kojima, Y. Kato, K. Tanaka and Y, Hayashi, "EEPROM with High Gate Injection Efficiency", 1982 IEDM technical Digest, 30.4, p741.

To achieve the PAC injection, a first conductive gate is disposed on a channel forming region at the source side via a gate insulator and a floating gate, on the channel forming region at the drain side. A carrier supplied from the source side to a surface of the channel forming region is once pushed from the surface to inside of the channel forming region at a drain side end portion of the first conductive gate and again drawn to the channel forming region under the floating gate. In this step, part of the carrier drawn thereto is injected in the floating gate getting over a potential barrier between the gate insulator and channel forming region surface. To have the carrier injected therein, it is required that the potential difference between the channel forming region and drain region be more than the height of the potential barrier ($V_B$) (The potential from the outside is $V_B - 2\phi_{F2}$; $2\phi_{F2}$ is a Fermi-level in the channel forming region).

It has recently been found that the critical film thickness of the gate insulator under the floating gate is 8 nm. "Thinning a tunnel oxide film reaches its limit at 8 nm . . . Limit to a large capacity flush memory" by S. Lai, disclosed at page 70 in "Nikkei Microdevice" published in April, 1967. The carrier injection is achieved in such a step that a control gate (or a drain gate in stead of a control gate) is capacitance-coupled with the floating gate via the insulator to control the floating gate potential, but the equivalent insulator thickness measured from the control gate becomes about twice that of the critical value. Accordingly, the control gate voltage during the programming is limited by the equivalent film thickness causing a limit to making the programming voltage lower.

Compared to the MNOS memory, the MONOS memory has achieved to some extents low voltage programming, but has problems to be resolved in terms of further reducing the programming time and realizing the lower voltage programming.

SUMMARY OF THE INVENTION

It is a purpose of the present invention to provide a nonvolatile memory cell capable of programming not onlyat a higher speed and with lower voltage compared to a MNOS memory but also with lower voltage compared to a conventional floating gate memory; and a method of programming the same and a high density nonvolatile memory array.

To achieve the purpose as described, the present invention is provided with the means featured below.

(1) A pair of source and drain regions formed in a main surface of a substrate and separated by channel forming regions therebetween; a first gate insulator formed on a surface of a first channel forming region adjacent to the source region out of the channel forming regions; a second gate insulator formed on a surface of a second channel forming region adjacent to the drain region out of the channel forming regions; a first gate electrode formed on the first gate insulator; and a second gate electrode formed on the second gate insulator, wherein the second insulator includes a first layer forming a potential barrier at the interface with the channel forming region; a third layer forming the potential barrier at the interface with the second gate electrode and the second layer forming the carrier trapping level at least a location out of the interfaces between the second layer and the first layer or the third layer and a location in the second film itself.

(2). A first potential feeding means which feeds to the drain region the first potential to supply to the carrier such energy as the carrier is capable of getting over the potential barrier formed between the second channel forming region and first layer of the second gate insulator; and a second potential feeding means which feeds to the second gate electrode a potential to form an auxiliary electric field capable of having the carrier having overcome the potential barrier reached the second layer of the second gate insulator.

(3) A pair of source and drain regions formed in a main surface of a substrate and separated therebetween by channel forming semiconductor regions in said main surface of said substrate; a second gate insulator at one side formed on a surface of a second channel forming region at one side adjacent to the source and drain region at one side out of the channel forming regions; a second gate insulator at the other side formed on a surface of a second channel forming region adjacent to the source and drain region at the other side out of the channel forming regions; a first gate insulator formed on a surface of a first channel forming region between each of the second channel forming regions; a second gate electrode at one side on the second gate insulator at one side; a second gate electrode at the other side on the gate insulator at the other side and a first gate electrode formed on the first gate insulation film, wherein the second gate insulators at one and the other sides are provided with a carrier charge trapping means. The carrier charge trapping means is fully demonstrated by a carrier trapping level formed in the gate insulator or in a layer and/or at the interface of each layer if the gate insulator is of a multi-layered structure and by conductive particulate formed from silicon and metal, etc. embedded in the gate insulator.

(4) The carrier injection from the second channel forming region to the second gate insulator is carried out by applying the predetermined potential to the drain region and second gate electrode respectively so that the energy to get over a potential barrier formed between the first layer of the second gate insulator and the second channel forming region may be applied to the carrier. Furthermore, the carrier extraction from the second gate insulator is conducted by applying to the second gate a potential whose polarity is the same as that applied when injecting the carrier therein so that electric field enabling the carrier to conduct tunnel-transition through a potential barrier layer formed between the second layer and the third layer of second gate insulating layer may be applied to the third layer.

According to the feature as described in (1) above, the carrier injected in the channel forming region from the source region is accelerated by the potential fed to the drain region and provided with so energy as to get over the potential barrier formed at the interface with the second gate insulator, thereby being injected in the second gate insulator. The injection into the second gate insulator is of high efficiency if the energy is given within the distance several (less than about 6) times of Lo in the second channel forming region, where Lo denotes a mean free path of a hot carrier. This is realized making the length of the second channel forming region shorter than 6 times of Lo. If the energy as described above is found to be insufficient for conducting the carrier injection, the gate potential applied to the second gate electrode is provided as an auxiliary means to attract the carrier to the second layer of the second gate insulator by the electric field generated thereby and capture the carrier. Part of the injected carriers are forwarded to the second gate side, but tunneling thereof to the second gate electrode of the carrier is stopped by the potential barrier between the second layer and third layer of the second gate insulator. It is, therefore, possible to capture the sufficient carriers even if the thickness of the second layer of the second gate insulator is formed thinner than the conventional one and eventually, to make the second insulator thin as a whole even if the third layer is added thereto. This enables reduction of the applied voltage to the second gate electrode when performing the carrier injection.

To inject a carrier in the second gate insulator, a carrier is first injected in the first channel forming region from the source region, according to the feature as described in (2) above. This carrier injection is achieved by forward-biasing the source region to the first channel forming region, or by feeding the potential exceeding the threshold voltage to the first gate electrode to induce a channel in the surface of the first channel forming region. Next, the predetermined potential is fed from the first potential feeding means to the drain region so that such energy as to get over the potential barrier formed at the interface between the second channel forming region and second gate insulator may be applied to the carrier. Furthermore, the predetermined potential is fed from the second potential feeding means to the second gate electrode so that an auxiliary electric field to have the carrier having overcome the potential barrier reached the second layer may be generated. To inject a carrier from the second channel forming region in one side in the second gate insulator in one side in the structure described in (3), a carrier is supplied first from the source and drain region at the other side to a channel formed in the second channel forming region at the other side, then supplied through said channel to a channel formed in the first channel forming region and then through the channel supplied to said second channel forming region in one side. Above mentioned each channel is induced in the respective channel forming region by applying to the second gate at the other side and first gate a respective potential larger than a gate threshold voltage of the respective gate.

According to the feature as described in (3) above, the stored data are independently held by the second gate insulator at one side and second gate insulator at the other side. It is, therefore, possible to store two-bit data in one-.memory cell and eventually, to provide a high integration density memory.

According to the feature as described in (4) above, it is possible to inject and extract the carrier to and from the second gate insulator by applying to any of second gate electrodes the potential whose polarity is the same both in the injection and extraction. This simplifies the circuit configuration and manufacturing process for a carrier injection and extracting.

DETAILED DESCRIPTION OF THE PREFERRED EMBODIMENTS

Figure 1:
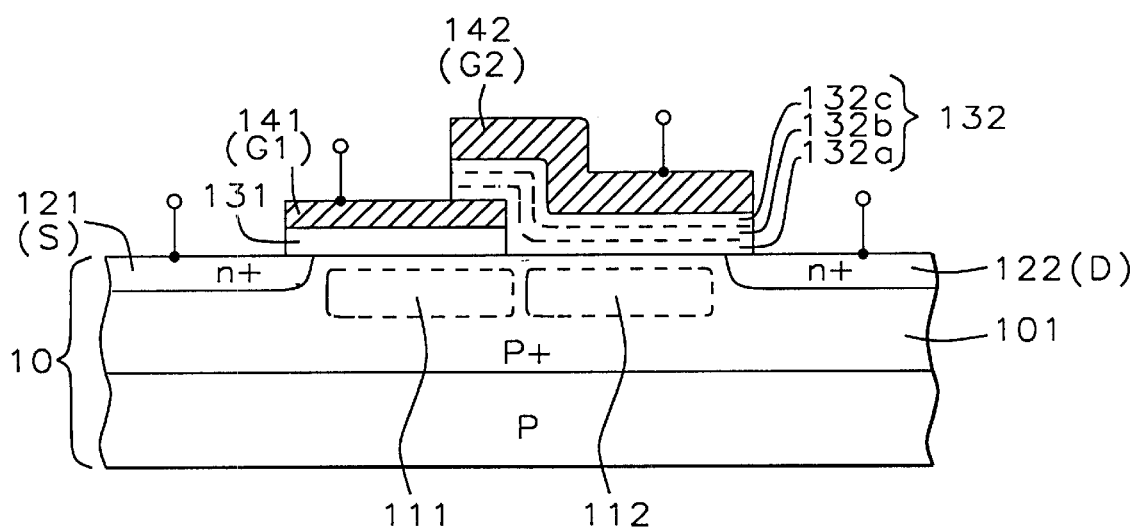
FIG. 1 shows a section of a nonvolatile memory cell in a first embodiment of the present invention.
Figure 2:
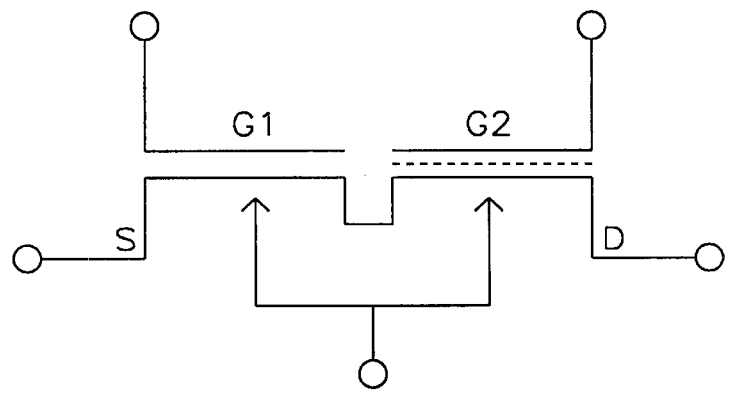
FIG. 2 shows an equivalent circuit of a nonvolatile memory cell in FIG. 1.

The detailed description of the present invention is now provided below in reference to the accompanying drawings. FIG. 1 shows a section of a nonvolatile memory cell in a first embodiment of the present invention and FIG. 2, an equivalent circuit thereto.

A well 101 is formed in a surface of a substrate 10 and a n+ source region (S) 121 and n+ drain region (D) 122 are formed at an interval in a surface of the well 101. Used as the substrate 10 is a semiconductor substrate or a SOI substrate in the main surface of which a semiconductor thin film is formed.

A first channel forming region 111 adjacent to the source region 121 is formed in a channel forming region between the source region 121 and drain region 122, and a second channel forming region 112 is formed adjacent to the drain region 122.

A first gate electrode (G1) 141 is formed on a first gate insulator on a surface of the first channel forming region 111. A second gate electrode (G2) 142 is formed on a second gate insulator 132 with carrier charge trapping means on a surface of the second channel forming region 112. The second gate electrode 142 and gate insulation film 132 thereof are extended to cover part and end surface of a drain side of the first gate electrode 141, and the first gate electrode 141 and second gate electrode 142 are insulated by the second gate insulator 132. As described above, an insulator to insulate the first gate electrode 141 and second gate electrode 142 may be separately formed as another (third) insulation film depending on a method of manufacturing thereof without being restricted by the extended gate insulator.

The second gate insulator 132 with the carrier charge trapping means is of a multilayer structure. Adopted in an embodiment of the present invention is of a three-layer construction wherein a first layer 132a (silicon oxide layer O or silicon nitrided oxide layer ON); a second layer 132b (silicon nitride film layer N, tantalum oxide film T or silicon oxi-nitride film ON whose oxygen to nitrogen ratio is smaller than that of the first and a third layer and a third layer 132c (silicon oxide film or silicon nitrided oxide film ON) which forms a potential barrier at the interface with the second gate electrode 142 are laminated in their order. With respect to the second layer of the second gate insulator 132, a carrier trapping level is formed at least at one location at the interface with the first layer 132a or third layer 132c or within the second layer itself and captured is a carrier injected from the second channel forming region (112) to the second gate insulator 132.

Next, described below is a principle of the operation regarding the memory cell as described above. According to an embodiment of the present invention, a carrier is first injected from the source region 121 to the channel forming region. Further, the carrier is injected from the second channel forming region 112 to the second gate insulator 132 overcoming the potential barrier therebetween. To inject a carrier from the source region 121 to the channel forming region, one of two conditions A and B below is required to be satisfied.

Condition A

A potential which is higher than the first gate threshold voltage (Vth1) in reference to the source region 121 is applied to the first gate electrode 141, or a predetermined potential is applied to the first electrode 141 and in a surface of the channel forming region under the first gate electrode 141, a channel is induced by a potential of the source region 121 which is lower than the value obtained by having the first gate electrode threshold voltage (Vth1) subtracted from the predetermined potential (PAC injection, CHE injection).

Condition B

The source region 121 is forward-biased to a channel forming region and minority carriers are injected in the channel forming region (MC injection). Furthermore, two conditions C and D below are required to be satisfied simultaneously in order to inject the carrier injected in the second channel forming region 112 via the first channel forming region 111 into the second gate insulator 132 getting over a potential barrier (VB) between the channel forming region 112 and second gate insulator 132 corresponding to the first layer 132a.

Condition C The potential difference (VDB) between the drain region 122 and channel forming region will be more than (VB−2φF2).

Condition D

The potential (VG2B) obtained by a formula (1) below will be applied to the second gate electrode 142 in reference to a channel forming region.

$$V_{G2B} = V_B + V_{th2} + (t_{i2}/\epsilon_{i2})*(2qN_{b2}\epsilon_{si})^{1/2}\{(V_B)^{1/2}-(-2\phi_{F2}+V_S)^{1/2}\} + \Delta V_{th} \qquad (1),$$

where

| | |
|---|---|
| ti2: | Film thickness of the second gate insulator 132 |
| $\epsilon$i2: | Permittivity of the second gate insulator 132 |
| $\epsilon$si: | Permittivity of a channel forming region |
| | (Permittivity of Si in an embodiment of the present invention) |
| q: | Unit charge (Charge of an electron) |
| Nb2: | Impurity concentration of the second channel forming region (112) |
| $\phi$F2: | Fermi-level of the second channel forming region 112 |
| Vs: | Potential of a source region |
| Vth2: | Gate threshold voltage of the second gate electrode 142 |
| VB: | Potential barrier height (value converted to volt) between a channel forming region and the second gate insulator |
| $\Delta$Vth: | Change in the gate threshold voltage of the second gate electrode (142) after programming |

With respect to the ti2 formed in the three-layer structured second gate insulator 132, ti2/$\epsilon$i2 is denoted by ti2-1/$\epsilon$i2-1+ti2-2/$\epsilon$i2-2+ti2-3/$\epsilon$i2-3, where, ti2-1 and $\epsilon$i2-1; ti2-2 and $\epsilon$i2-2; and ti2-3 and $\epsilon$i2-3 is the film thickness and permittivity of the first layer 132a; the second layer 132b; and the third layer 132c, respectively. $\epsilon$i2may be any of $\epsilon$i2-1, $\epsilon$i2-2 and $\epsilon$i2-3 or the intermediate value therebetween, but the permittivity of the first layer is generally adopted in many cases.

According to an embodiment of the present invention, if the condition C is satisfied, the potential or kinetic energy getting over the potential barrier (VB) is applied to the carrier within the second channel forming region 121 and the carrier is injected within the second gate insulator 132 getting over the potential barrier caused by the first layer 231 and further, if the condition D is satisfied, the carrier having got over the potential barrier (VB) is attracted to the second layer and stored. As will be recited below the applied potential (Condition D) to the second gate electrode 142 may be the one which is smaller than that as described above. While, the second gate electrode 132 is of a three-layer structure according to an embodiment of the present invention and thus, the carrier injected from the second channel forming region 112 into the second gate insulator having overcome a potential barrier is stopped to be injected (tunnel-through) into the gate electrode 142 by a potential barrier formed between the second layer and the third layer 132c of the second gate insulator. It is, therefore, possible to capture the carrier even if the thickness of the second layer 132b is made thin.

As described above, it is, according to an embodiment of the present invention, to make the thickness of the second layer 132b thin and eventually, to reduce that of the entire second gate insulator 132, since the gate insulator 132 is of a three-layer structure. Thus, the value of the third term at the right side [(ti2/$\epsilon$i2) . . . +Vs$^{1/2}$}] equation (1) is half that of a floating gate memory or MNOS memory. About one volt voltage reduction is possible as an example of an absolute value and the second electrode potential (VG2B) is 4.1V+$\Delta$Vth. Furthermore, it is possible to make the programming current flowing in the second gate insulator 132 greater than one order of magnitude compared to the current necessary for the conventional MONOS programming and a program time one order of magnitude smaller is realized.

Also, if an energy larger than the potential barrier VB is supplied to a carrier with a potential drop of more than VB in a surface of the channel forming region adjacent to the drain region which is within a distance several times equal or less than about 6 times the mean free path of a hot carrier Lo ($\leq$10 mn) during the channel hot electron (CHE) injection, the potential barrier (VB) against a carrier can be overcome even with a gate potential (second gate electrode potential, e.g. 1–2V) which is smaller than the gate potential (VG2B) in the equation (1) due to the ballistic effect generated by a step channel structure (see S. Ogura, A. Hori, J. Kato, M. Yamanaka, S. Odanaka, H. Fujimoto, K. Akamatsu, T. Ogura, M. Kojima and H. Kotani, "Low Voltage, Low Current, High Speed Program Step Split Gate Cell with Ballistic Direct Injection for EEPROM/Flash" 1998 IDEM, Technical Digest, 36.5, p.987) and the carrier can arrive at the second layer getting over the potential barrier. The gate electrode potential in the step channel structure as described above is represented by VB–$\psi$GB hereinafter below where $\psi$GB is the work function difference between the gate material and second channel forming region.

Even if the step channel structure is not provided therein, an auxiliary electric field from the second gate electrode can be reduced to be a far smaller value including zero owing to a change of a direction of a carrier movement to the second gate by lattice scattering in the surface of the channel forming region, if the energy adequately greater than that of the potential barrier is supplied to the carrier by the aforementioned potential drop more than VB in the surface of the channel forming region within the distance of several times of Lo with the channel forming region equal to or shorter than about 6 times of Lo. This achieves the carrier injection with a gate potential which is smaller than the value VG2B in equation (1) above.

According to the respective conditions as described above, the carrier is injected from part of the second channel forming region 112 into the second gate insulator 132 and trapped in part field therein becomes attenuated and thus, further injection is conducted around the portion in which the carrier is already trapped. Next, a carrier erase (extraction)mechanism in the memory cell is described below. Since the three-layer structure is adopted in the second gate insulator 132 according to an embodiment of the present invention, two types of erase mechanism below can be selectively used.

(a) First Erase Mechanism

A potential whose polarity is the same as that of the carrier charge is fed to the second gate electrode 142 and the carrier which is injected and captured in the second layer of the second gate insulator is returned via tunnel to the channel forming region through the first layer 132a (The average electric field required for this step is about 8 MV/cm). To adopt this erase mechanism, a carrier tunnel probability of the first layer 132a is preferably predetermined to be higher than that of the third layer 132c. More particularly, the thickness of the first layer 132a is made thinner than that of the third layer 132c if the material of each potential barrier layer 132a and 132c is the same. Adopted is such material combination that the barrier height between the first and second layer viewed from the second layer 132b to the carrier may be lower than that between the second and third layers if each thickness thereof is the same.

(b) Second Erase Mechanism

A potential whose polarity is different from that of the carrier charge is fed to the second gate electrode 142 and the carrier which is injected and captured in the second layer of the second gate insulator is extracted by tunnel-transferring the third layer 132c. To adopt this erase mechanisms, a carrier tunnel probability of the third layer 132c is preferably predetermined to be higher than that of the first layer 132a. More particularly, the thickness of the third layer 132c is made thinner than that of the first layer 132a if the material of each potential barrier layer is the same. Adopted is such material combination that the barrier height between the second and third layers viewed from the second layer 132b to the carrier may be lower than that between the first and second layers if each thickness thereof is the same. In order to adopt the first erase mechanism, it is required to supply to the second gate electrode 142 the potential whose polarity changes depending on the programming and erasing operation. That is, if the carrier is assumed to be an electron, the positive potential is required to be applied when programming and the negative potential, when erasing. However, additional circuits to generate a high potential with a different polarity on a LSI and structures to isolate negative potential generated portions are necessary which results in increasing the manufacturing cost.

While, according to an embodiment of the present invention, both carrier injection and extraction are possible only by supplying to the second gate electrode 142 the potential with the same polarity and different levels if the second erase mechanism is specifically adopted.

According to an embodiment of the present invention, the second gate insulator 132 is of a three-layer structure and the third layer 132c as a potential barrier layer is disposed at the interface with the second gate electrode 142. This makes thinner the second layer 132b with keeping carrier charge trapping function and enables the carrier extraction to the gate side by the tunnel transition through the third layer 132c. However, if the potential to extract the carrier to the gate side is applied to the second gate electrode 142, the electric field caused by this potential is also effective to a carrier within the channel forming region 112. In a conventional memory structure wherein the carrier injection from the channel forming region to the second gate insulator 132 is conducted by a tunnel transition, the probability of a carrier tunnel within an insulator (corresponding to the first layer 132a in an embodiment of the present invention) formed on a surface of a channel forming region is predetermined to be high. This causes the simultaneous tunnel injection from the channel forming region 112 to the second gate insulator 132 and makes it substantially impossible to extract the carrier from the second gate insulator 132.

While, it is possible to make adequately low the probability of the carrier tunnel across the first layer 132a (channel forming region side) since the carrier injection from the channel forming region 112 to the second gate insulator 132 is conducted not by tunnel transfer but by overcoming the potential barrier according to an embodiment of the present invention. Thus, it is possible to extract a number of injected carriers through the third layer 132c by reducing the tunnel injection volume to the second gate insulator to be negligibly small even if the second gate electrode 142 is made to be in the high potential.

In the case the second erase mechanism is adopted, a silicon oxide film (O) and silicon nitrided oxide film (ON), etc. are preferably used for the first layer 132a and the thickness of each film is desired to be more than about 3 nm. Further, a silicon nitride film (N) and tantalum oxide film (T) are preferably used for the second layer 132b and the silicon nitride film thickness is desirably less than 10 nm for the low voltage programming, however, it is confirmed that the programming is possible even with 4 nm thick film.

The silicon nitride film of the second layer 132b may include smaller volume of oxygen in atomic percent than that in the silicon nitrided oxide film used in the first and third layers. The thickness of the tantalum oxide is preferably less than about 50 nm. It is recommended that the silicon oxide film (O) or the silicon nitrided oxide film (ON) be used for the third layer and the film thickness thereof be more than about 2 nm.

That is, combinations among the first, second and third layers of the second gate insulator can be designated such as O/N/O, ON/NO, ON/N/ON, O/N/ON, O/T/O, ON/T/O, ON/T/ON AND O/T/ON.

It is possible to provide a memory cell which is programmable and erasable with low voltage and same polarity if the memory cell is so structured that the first layer 132a is comprised of a silicon oxide film or a silicon nitrided oxide film with the film thickness of about 3–4 nm and the third layer, a silicon oxide film or a silicon nitrided oxide film with the film thickness of about 2–4 nm. However, if a silicon oxide film is used for the first layer and a silicon nitrided oxide film is adopted for the third layer, the film thickness of both layers may be the same. The reason for this is that a potential barrier between the second layer and the first layer viewed from the second layer against the silicon nitrided oxide film is low and the carrier tunnel probability to the third layer becomes larger than a potential barrier between the second layer and the first layer even if the film thickness is the same. Also, it is possible to make the thickness of the third layer thinner than that of the first layer if the silicon nitrided oxide film is used for each layer.

While, if the potential more than the value (V$_B$−2$\square$F2) in the condition C is supplied to the drain region 122 and a depletion layer is extended from the drain region 122 to a surface of the second channel forming region 112 and arrived at the first channel forming region, the potential difference or energy to be given to the carrier in the second channel forming region 112 is lowered and the carrier injection efficiency to the second gate insulator 132 is decreased.

To prevent the carrier injection efficiency decrease as described above, it is preferred that the impurity concentration (Nb2) of the second channel forming region 112 be higher than the impurity concentration (Nb1) of the first channel forming region 111. It is also recommended that a rough target value of the impurity concentration (Nb2) be the value given by an equation below if an effective channel length of the second channel forming region 112 is Leff.

$$Nb2 > \epsilon si(V_B - 2\psi F2)/q\, Leff \qquad (2)$$

If the effective channel length (Leff) is 60 nm, Nb2 is required to be more than 4E17 cm$^{-3}$ according to the equation (2) above. As evident from the equation (2), the impurity concentration becomes four times the rough target value if the effective channel length (Leff) of the second channel forming region 112 becomes a half The equation (2) is the one representing the relation that the impurity concentration of the second channel forming region 112 is uniform and a drain region has the same impurity concentration portion as that of the second channel forming region. It is, therefore, necessary to establish a higher value with respect to the impurity concentration of the second channel forming region if the impurity concentration of the second channel forming region 112 is made high in part or the drain region 122 is made to be higher in its impurity concentration.

Figure 3:
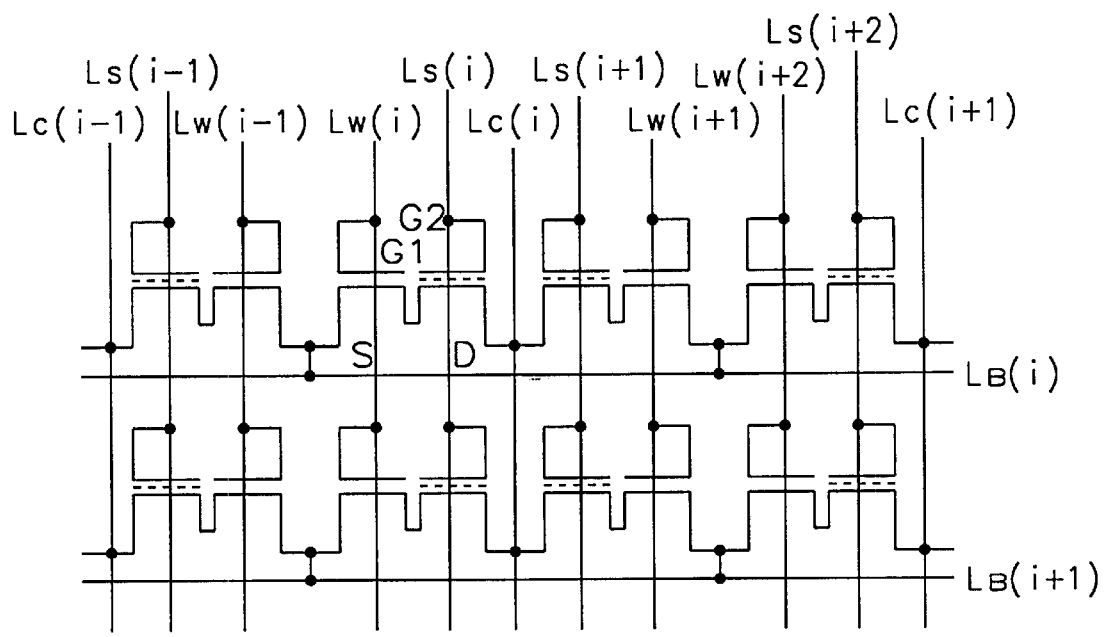
FIG. 3 shows a circuit configuration for a nonvolatile memory array in a first embodiment of the present invention.

If the impurity concentration of the second channel forming region 112 is made to be higher than that of the first channel forming region 111 is confirmed by the fact that a punch-through voltage from the drain region (greater reverse bias is fed to a drain region than to a source region.) becomes smaller than that from the source region if voltage is applied between the drain and source regions. Next, provided below is the description regarding a nonvolatile memory array so configured that the nonvolatile memory cell as described above is aligned in the form of a matrix. FIG. 3 shows an example of a connection configuration of a first nonvolatile memory array.

A source region (S) 121 of each memory cell on a same row is connected by a bit line (LB). A drain region (D) 122 of memory cells adjacent to the direction of a row is commonly connected and connected to the direction of a column by a common line (Lc). A first gate electrode (G1) 141 of each memory cell on a same column is connected by a word line (Lw). A second gate electrode (G2) 142 of each memory cell on a same column is connected by a control line (Lc).

Figure 4:
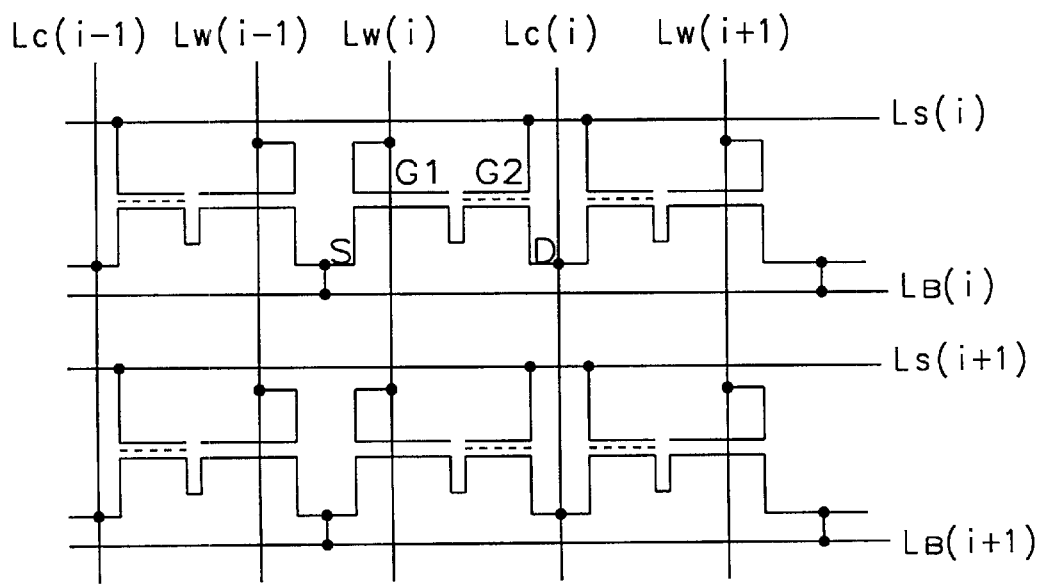
FIG. 4 shows a circuit configuration for a nonvolatile memory array in a second embodiment of the present invention.

FIG. 4 shows a connection configuration of a second nonvolatile memory array. A source region (S) 121 of each cell on a same row is connected by the bit line (LB). Each drain region (D) 122 of the memory cells adjacent to the direction of a row is connected and also connected by a common line (Lc) in the direction of a column. A first gate electrode (G1) 141 of each memory cell on a same row is connected by a word line (Lw). A second gate electrode (G2) 142 of each memory cell on a same row is connected by a control line (Lc).

Figure 5:
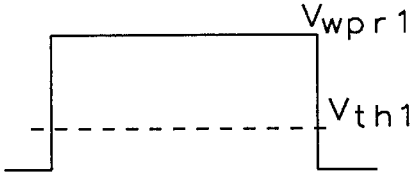
FIG. 5 is a signal waveform illustration showing a programming and reading method for a memory array.

FIG. 5 is a signal waveform illustration showing a method of programming a memory array in the first and second connection configuration. When programming (writing) the selected memory cell, a channel is formed by applying to the first gate electrode 141 the potential (Vwpr1) which is higher than the gate threshold voltage (Vth1) on the first gate electrode 141. According to the condition C, the potential which is higher than the value (VB−2ψF2) is applied to the selected common line (drain region 122)(LC), and applied to an unselected common line (LC) is an adequate potential (including zero volt) in the direction of the reverse bias which is lower than junction breakdown voltage. According to the condition D, the potential which is higher than VG2B(or VB−2φGB) is applied to the selected control line (second gate electrode 142)(LS), and applied to an unselected common line (LC) is such predetermined potential (including zero volt) that the programming may not be caused by tunnel current. Applied in advance to a bit line (LB) is a predetermined potential (VBPr) which is higher than the value (Vwpr1−Vth1) obtained by subtracting the threshold voltage (Vth1) from the potential (Vwpr1) to be fed to the word line (Lw). When programming a memory array, the potential (VBPr1) which is higher than the difference value (Vwpr1−Vth1) or the potential (VBPr0) which is lower than the difference value (Vwpr1−Vth1) is applied thereto depending on the content of the data stored. In this step, it is possible to program information in the form of a multivalue if the applied potential (VBPr0) to the bit line (LB) is selected out of multi value as shown with broken lines.

Based on the program operation as described above, a carrier injected from the source region 121 to the channel forming region is injected in the second layer 132b by getting over the potential barrier between the second channel forming region 112 and second gate insulator 132 (first layer 132a) and thus, the information responsive to the potential applied to the bit line (LB) is stored in the form of nonvolatility.

When reading the data stored in the selected memory cell, the reverse bias potential (VBRD) is applied to the bit line (LB) of the memory cell and applied to the control line (LS) is the potential (VCRD) which is higher than the smaller value out of the programmed gate threshold voltage (Vth2) of the second gate electrode 142 and also, applied to the word line (Lw) is the potential (VwRD) which is higher than the gate threshold voltage (Vth1) in the first gate electrode 141. In the state as described above, whether a memory cell is on or off, i.e. the data are stored in the memory cell is judged by detecting the current (iWRD) flowing in the bit line (LB) by a sensing amplifier. The data judgment as described above may be made not by directly detecting the current but by the discharge speed (potential change) of an electric charge which has charged the bit line.

However, the methods for configuring and programming a memory cell may be modified as follows not limiting to those as described above.

Figure 6:
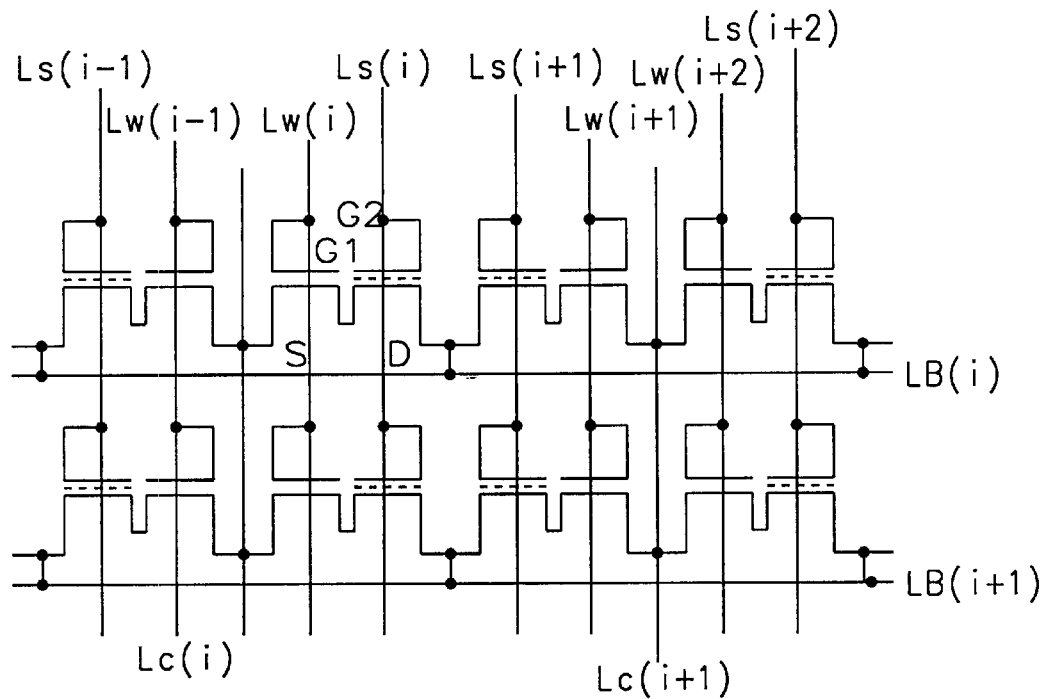
FIG. 6 shows a circuit configuration for a nonvolatile memory array in a third embodiment of the present invention.

FIG. 6 is an illustration showing a first modified example of the connection configuration. A source region (S) 121 of memory cells adjacent to the direction of a row is commonly connected and is connected by a common line (Lc) to the direction of a column. A drain region (D) 122 of each memory cell in a row direction is connected by a bit line (LB). A first gate electrode (G1) 141 of each memory cell in a column direction is connected by a word line (Lw). A second gate electrode (G2) 142 of each memory cell in a column direction is connected by a control line (Lc).

Figure 7:
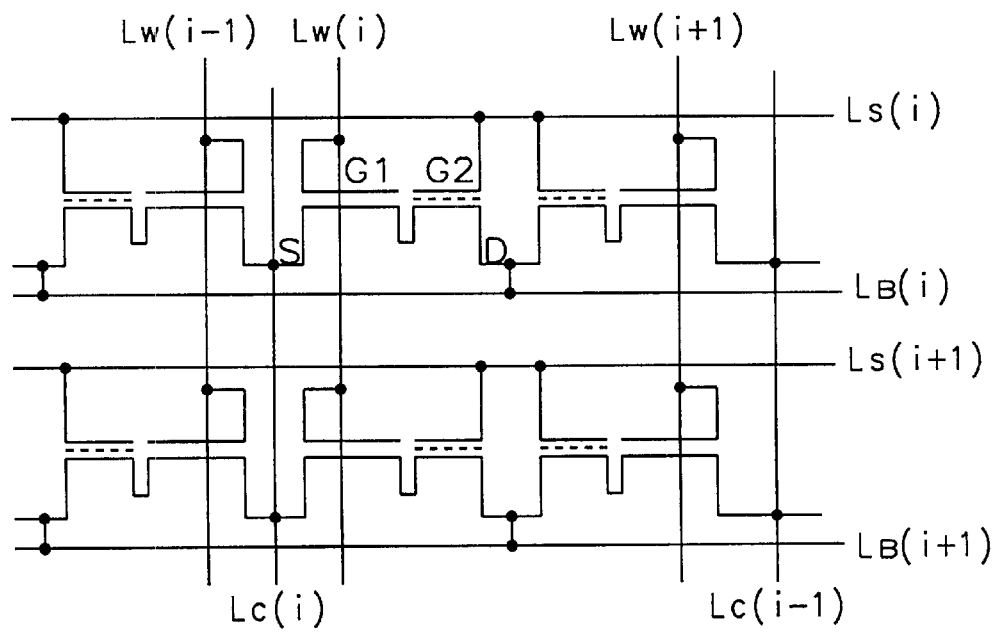
FIG. 7 shows a circuit configuration for a nonvolatile memory array in a fourth embodiment of the present invention.

FIG. 7 is an illustration showing a second modified example of a connection configuration. A source region 121 of each memory cells adjacent to the direction of a row is commonly connected and connected by a common line (Lc) to the direction of column. A drain region (D) 122 of each memory cell in a row direction is connected by a bit line (LB). A first gate electrode 141 of each memory cell in a column direction is connected by a word line (Lw). A second gate electrode 142 of each memory cell in a column direction is connected by a control line (Ls).

Figure 8:
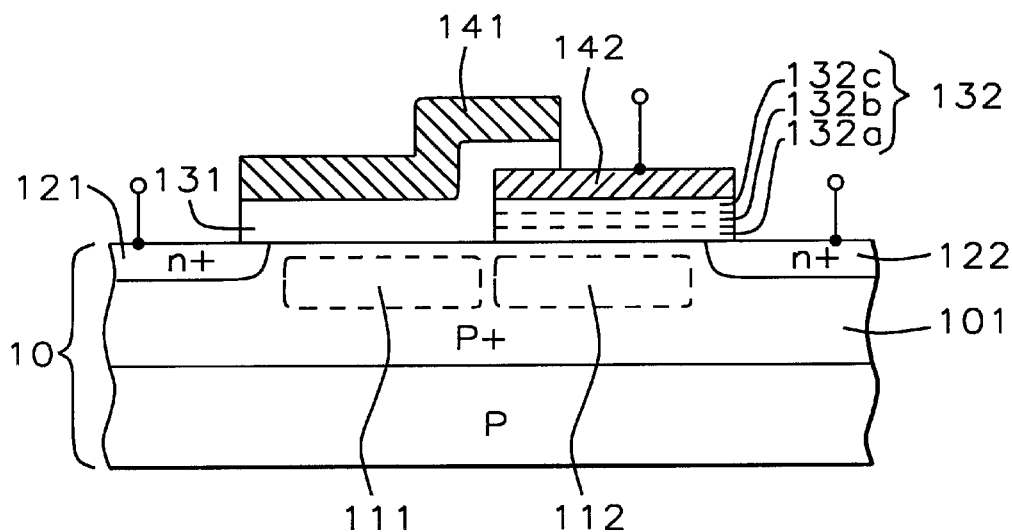
FIG. 8 shows a section of a nonvolatile memory cell in a second embodiment of the present invention.

FIG. 8 shows a section of a nonvolatile memory cell in a second embodiment of the present invention. The same symbols as those used in the previous description represent the same or corresponding portions therein. According to the second embodiment of the present invention, contrary to the structure in a first embodiment of the present invention is the structure that a first gate electrode 141 and gate insulator 131 thereof are superimposed with a second gate electrode and gate insulator 132 thereof at each end portion wherein the first gate electrode 141 and gate. insulator 131 thereof are extended to cover a surface and end surface at the source side of the second gate electrode 142.

Figure 9:
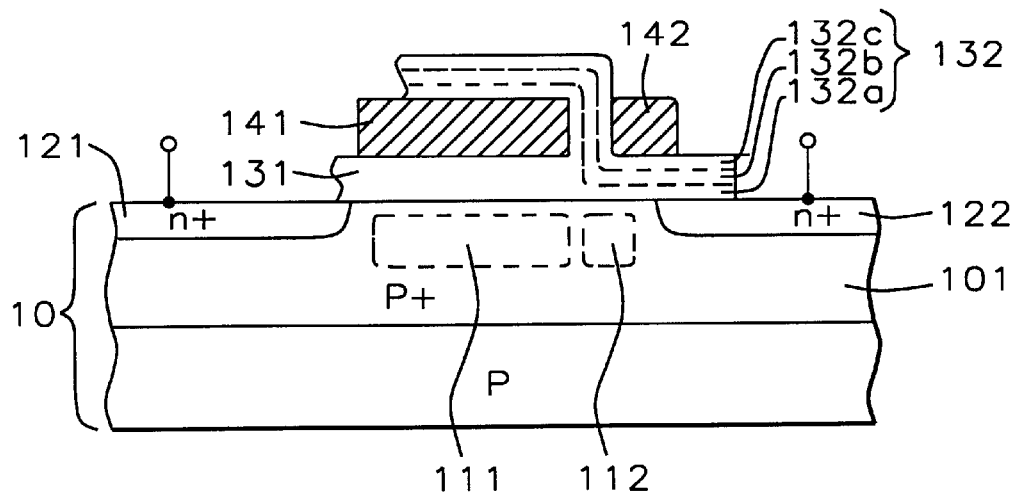
FIG. 9 shows a section of a nonvolatile memory cell in a third embodiment of the present invention.

FIG. 9 shows a section of a nonvolatile memory cell in a third embodiment of the present invention. The same symbols as those used in the previous description represent the same or corresponding portions therein. According to the third embodiment of the present invention, a first and second electrodes 141 and 142 are disposed in parallel by having a second gate insulator 132 formed therebetween and are reciprocally insulated by the second insulator 132.

In the first to the third embodiments of the present invention, provided previously was the description that the first and second electrodes 141 and 142 are insulated with a first insulator 131 or a second 132, but the insulation may be made with other (third) insulator. Or achieved may be multiple insulation in such a manner that the first gate insulator 131 or the second 132 is used, or the second 132 in combination with other insulation films.

Figure 10:
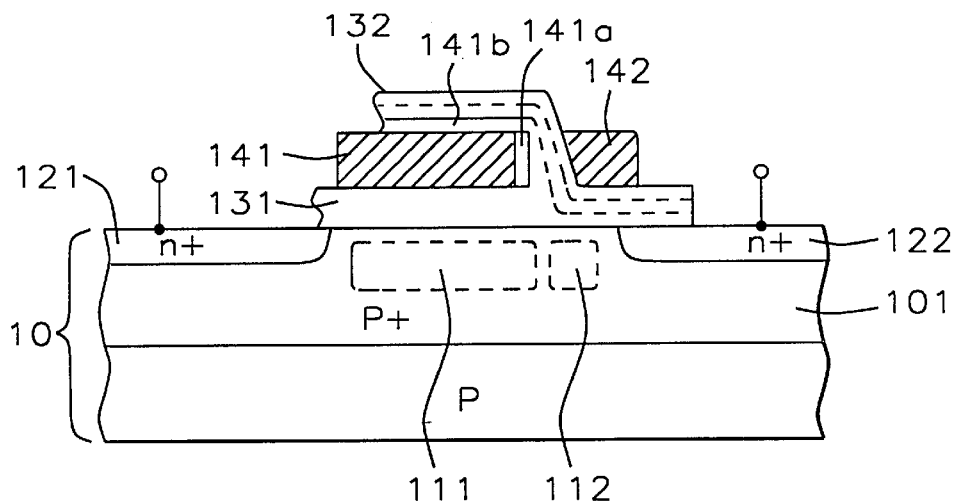
FIG. 10 shows a section of an example modified from a nonvolatile memory cell in a third embodiment of the present invention.

As shown in FIG. 10 as a typical example of the present invention, in order to reduce the coupling capacitance between the first gate electrode 141 and second gate electrode 142 and improve a drive speed, a nitride film 141b may be formed in advance on an upper surface of the gate electrode 141 or an end surface of the gate electrode 141 can be oxidized to form an oxide film 141a or an surface of a side-wall (not shown in accompanying drawings) as an insulating material may be formed at a side surface of the gate electrode 141 in place of an oxide film 141b. It is possible to form the side-wall by uniformly forming an insulating layer on, e.g. a main surface of the substrate 10 and selectively removing the insulator therefrom via an anisotropic etching method thereof.

Figure 11:
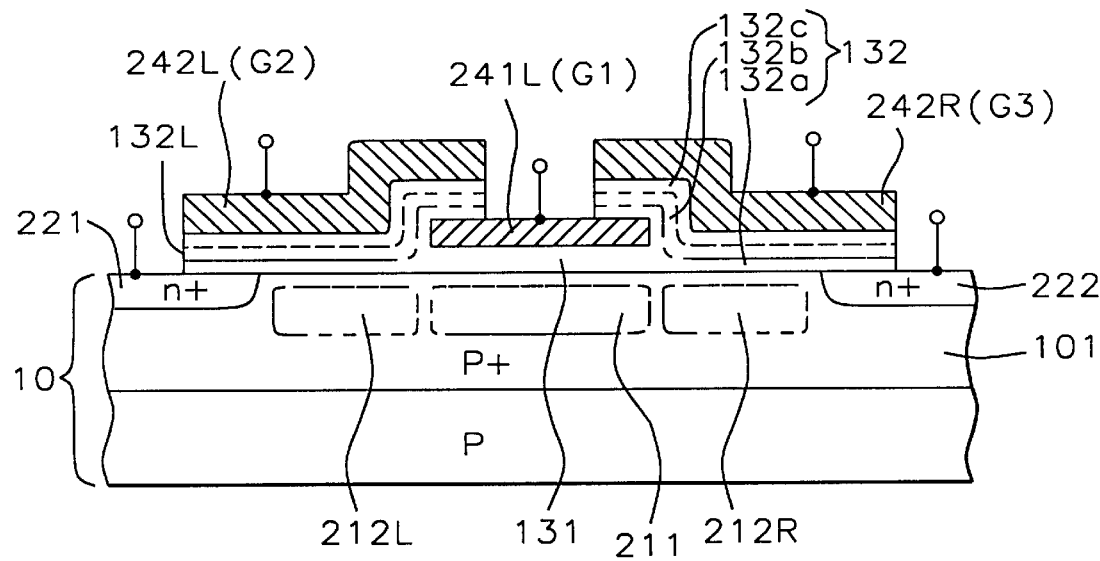
FIG. 11 shows a section of a nonvolatile memory cell in a fourth embodiment of the present invention.
Figure 12:
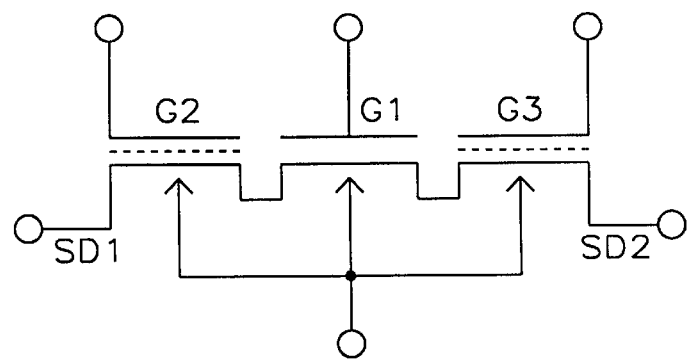
FIG. 12 shows an equivalent circuit of a nonvolatile memory cell in FIG. 11.

FIG. 11 shows a section of a nonvolatile memory cell in a fourth embodiment of the present invention and FIG. 12, an equivalent circuit to a nonvolatile memory cell in FIG. 11. The same symbols as those used in the previous description represent the same or corresponding portions therein. A nonvolatile memory cell in a fourth embodiment of the present invention is featured in that the data corresponding to two bits can be independently stored in a memory cell.

A well 101 is formed in a surface of the substrate 10 and a pair of n+ source/drain regions $SD_1$ (121) and $SD_2$ (122) are formed at an interval in a surface of the well 101. In a channel forming region between each source and drain regions 221 and 222, formed are a first channel forming region 211 and second channel forming regions 212L and 212R at one and the other sides along the channel direction. Each of the second channel forming regions 212L and 212R is disposed adjacent to each source and drain regions 221 and 222. The first channel forming region 211 is disposed between the second channel regions 212L and 212R.

A first gate electrode (G1) 241 is formed on a first gate insulator 131 on a surface of the first channel forming region 211. A second gate electrode (G2) 242L at one side is formed on a second gate insulator 132L with charge storing means at one side on a surface of the second channel forming region 212L. The second gate electrode 242L at one side and gate insulator 132L are extended to cover part and end surface of the first gate electrode 241 at the one side of source and drain region 221 side, and the first gate electrode 241 and the second gate electrode 242L at one side are insulated by the second gate insulator 132L at one side.

Likewise, a second gate electrode (G3) 242R at the other side is formed on a second gate insulator 132R with charge storing means at other side on a surface of the second channel forming region 212R at the other side. The second gate electrode 242R and gate insulator 132R thereof at the other side are extended to cover part and end surface of the first gate electrode 241 at the other side, and the first gate electrode 241 and second gate electrode 242R at the other side are reciprocally insulated by the second gate insulator 132R at the other side. According to the fourth embodiment of the present invention, each of the second gate insulators 132L and 132R is of a multilayer structure to achieve a low voltage programming and as described in each embodiment of the present invention, a first layer 132a (silicon oxide layer O or silicon nitrided oxide layer ON) forming a potential barrier at the interface with the channel forming region; a second layer 132b (silicon nitride film layer N, tantalum oxide film T or silicon oxi-nitride film ON whose oxygen to nitrogen ratio is smaller than that of the first layer and third layer) and a third layer 132c (silicon oxide film O or silicon nitrided oxide film ON) which forms potential barrier at the interface with the second gate electrode 142 are laminated in their order. However, if the low voltage drive as described above is not required, each of the second gate insulators 132L and 132R is adequate to have charge storing means, e.g. the film may be of a two-layer structure.

In the construction as described above, when injecting the carrier in the second gate insulator 132L at one side, the carrier is injected from a source/drain region 222 at the other side to a second channel forming region 212R at the other side and further, to the second channel forming region 212L at one side via the first channel forming region 211. The carrier which has been injected as far as the channel forming region 212L at one side is further injected in the gate insulator 132L at one side by getting over the potential barrier thereto.

Likewise, when injecting the carrier in the second gate insulator 132R at other side, the carrier is injected from a source/drain region 221 at one side to the second channel forming region 212R at one side and further, to the second channel forming region 212L at other side via the first channel forming region 211. The carrier which has been injected as far as the channel forming region 212R at the other side is injected in the gate insulator 132R at the other side by getting over the potential barrier thereto.

According to the fourth embodiment of the present invention, it is possible to independently memorize the data stored in each of the second gate insulators 132L and 132R and thus, to store two-bit data in one cell which results in providing a high integration density memory.

However, it is possible to program a memory cell with low voltage if each of the second gate insulators 132L and 132R is of a three-layer structure and a carrier injection from a channel forming region to a gate insulator is performed by getting over the potential barrier, according to the fourth embodiment of the present invention.

Furthermore, if the carrier is extracted to a gate electrode by controlling each carrier tunnel probability of a first layer and a third layer of the second gate insulators 132L and 132R in the same manner as described above, both carrier injection and extraction are achievable by feeding to the gate electrode the potential whose polarity is the same and whose level is different.

Figure 13:
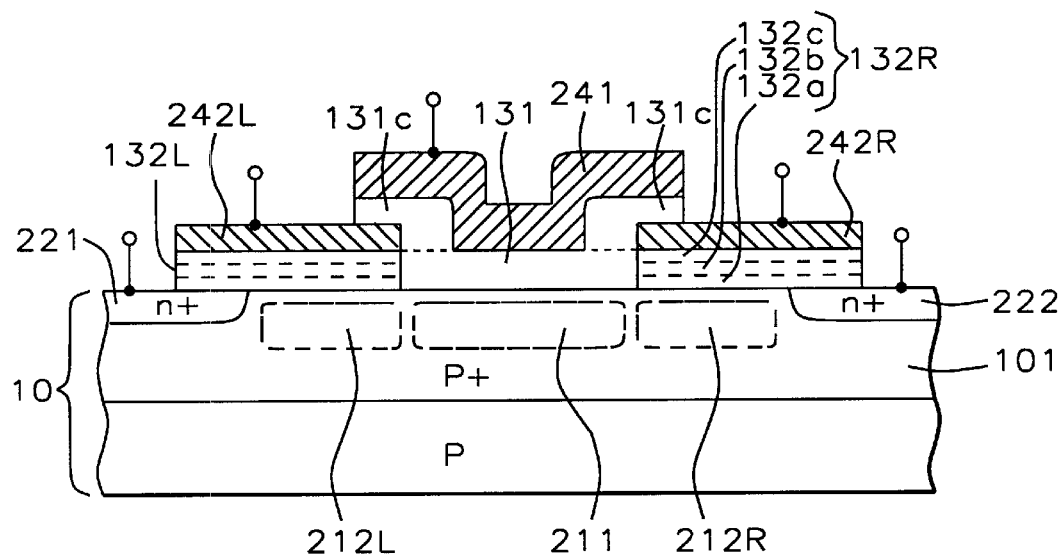
FIG. 13 shows a section of a nonvolatile memory cell in a fifth embodiment of the present invention.

FIG. 13 shows a section of a nonvolatile memory cell in a fifth embodiment of the present invention. The same symbols as those used in the previous description represent the same or corresponding portions therein. The structure of a memory cell disclosed in the fourth and the fifth embodiment of the present invention is different with respect to a relation between the upper and lower portions of an electrode wherein both ends of the first gate electrode 241 (and a gate insulator or other insulator 131c) are formed to cover the end portion and end surface of each of the second gate electrodes 242L and 242R at one and the other sides.

The same advantage as that in the second embodiment of the present invention is achieved in this fifth embodiment thereof. Furthermore, provided is a structure suitable for interconnecting the first gate electrode 241 across source/drain regions 221 and 222 according to the fifth embodiment.

Figure 14:
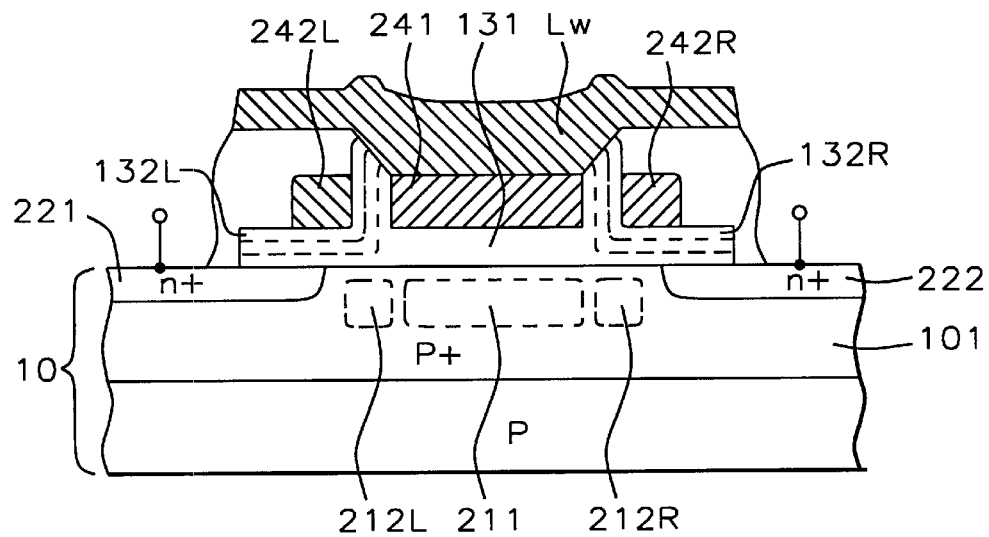
FIG. 14 shows a section of a nonvolatile memory cell in a sixth embodiment of the present invention.

FIG. 14 shows a section of a nonvolatile memory cell in a sixth embodiment of the present invention. The same symbols as those used in the previous description represent the same or corresponding portions therein. According to the sixth embodiment, a first gate electrode 241 is formed on the first gate insulator 131 on a surface of the first channel forming region 211. Each of the second gate insulators 132L, and 132R is formed between the second channel forming regions 212L and 212R and second gate electrodes 242L and 242R, and further, extended to a gap between the first gate electrode 241 and second electrodes 242L and 242R.

Second gate electrodes 242L and 242R at one and the other sides are formed as a pair of side-walls on the second gate insulator 132 on a surface of each of the second channel forming regions 212L and 212R. A word line (Lw) is connected to an upper portion of the first gate electrode 241. The same advantage as that in the fourth and fifth embodiments of the present invention is achieved in this sixth embodiment.

Figure 15:
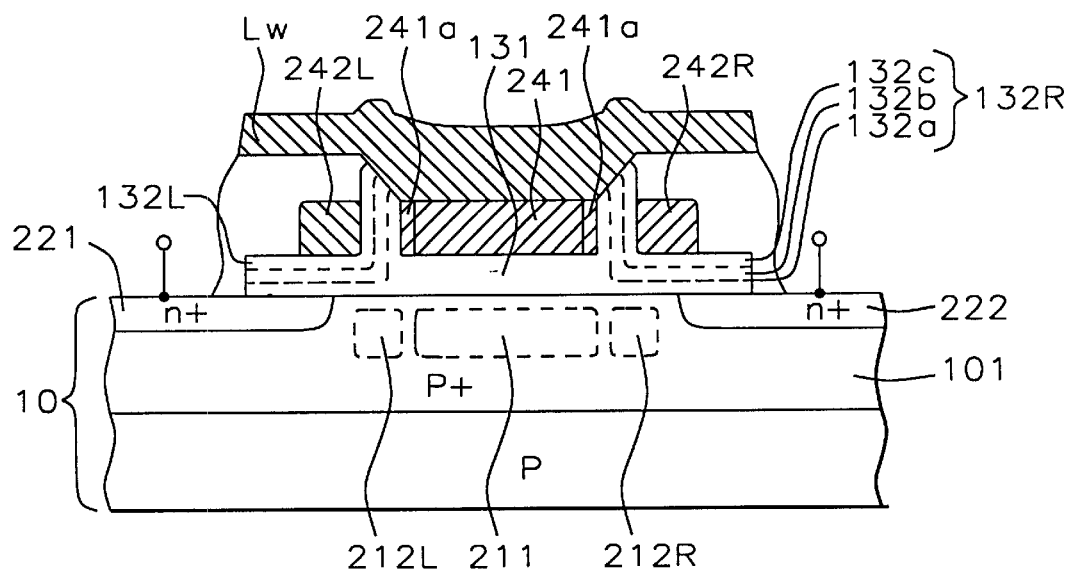
FIG. 15 shows a section of an example modified from a nonvolatile memory cell in a sixth embodiment of the present invention.

In the sixth embodiment of the present invention, however, the word line (Lw) is connected to the first gate electrode 241 after forming a second gate insulator 132 on the entire upper surface of the first gate electrode 241 and by having an upper surface thereof exposed. As shown in FIG. 15, the insulator 132 becomes thin in thickness at an upper portion of the gate electrode 241 and the insulation effect on the upper portion is deteriorated. In the case of the foregoing, an end surface of the gate electrode 241 can be oxidized to form an oxide film 241a or in place of the oxide film 241a, a side-wall insulator (not shown in accompanying drawings) as insulating material maybe formed on a side surface of the gate electrode 241 as shown in FIG. 15.

As described above, the high speed and low voltage programming is achievable since it is possible to reduce the capacitance between each gate if each gate electrode is insulated together with not only gate insulators but also other insulators.

Figure 16:
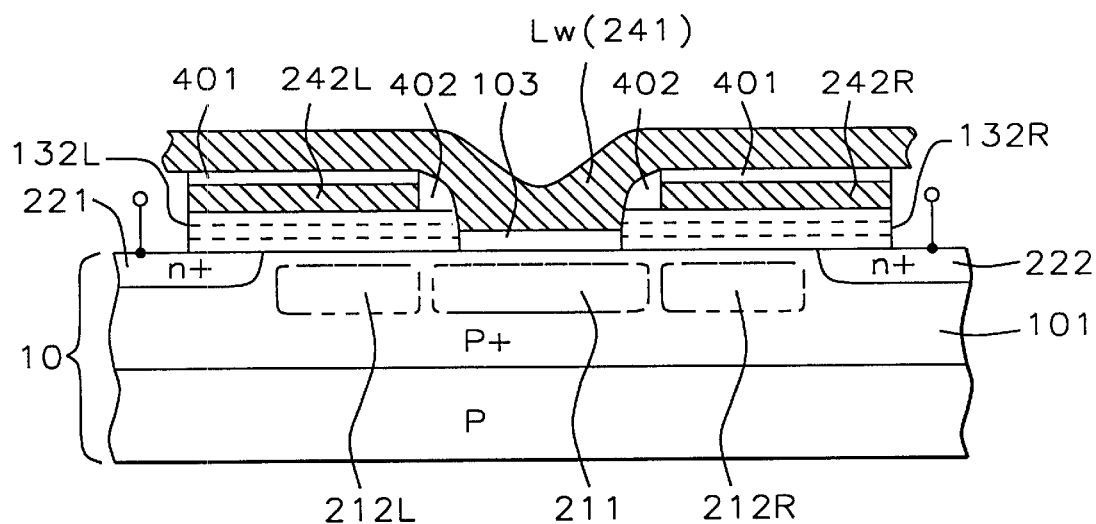
FIG. 16 shows a section of a nonvolatile memory cell in a seventh embodiment of the present invention.
Figure 17:
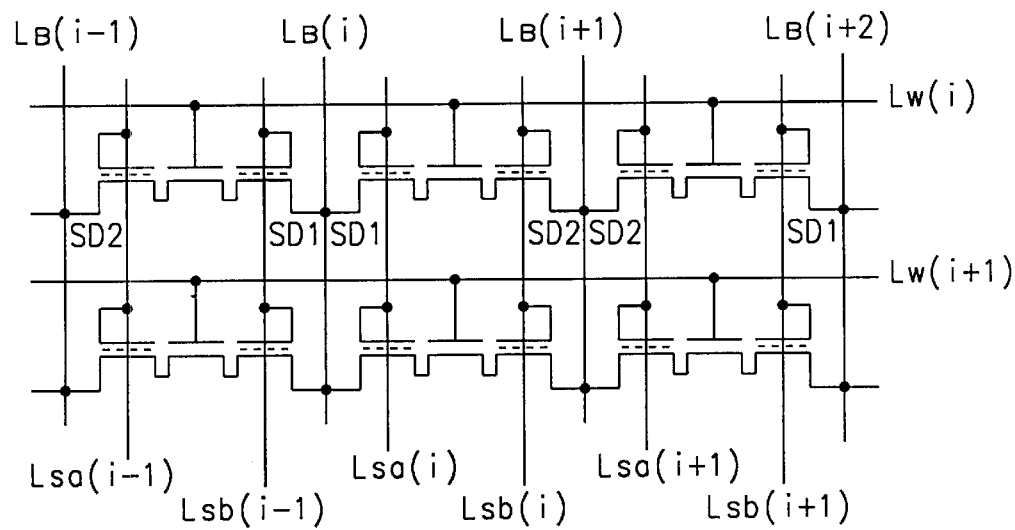
FIG. 17 shows an example of a circuit configuration for a memory array.

FIG. 16 shows a section of a nonvolatile memory cell in a seventh embodiment of the present invention. The same symbols as those used in the previous description represent the same or corresponding portions therein. According to the seventh embodiment of the present invention, each of the second gate insulators 132L and 132R is of a three-layer structure as described above, while the first and second gate electrodes are insulated from each other by the insulator 401 formed on a surface of each of the second gate electrodes 242L and 242R and a side-wall insulator formed on a side surface of each of the second gate electrodes 242L and 242R. Further, part of the second gate insulator 132 is etched to reform the first gate insulator 103. The same advantage as that in the embodiments of the present invention is achievable in this seventh embodiment. Next, provided is the description of a nonvolatile memory array so configured and structured that a nonvolatile memory cell is aligned in the form of a matrix. FIG. 17 shows an example of a first configuration for the nonvolatile memory array and FIG. 18, an example of a second configuration for the nonvolatile memory array. In FIG. 17, source and drain regions $SD_1$ (221) and $SD_2$ (222) of memory cells adjacent to a direction of a row is commonly connected and to a direction of a column is connected by a bit line (LB). A first gate electrode (G1) 241 in a column is connected by a word line (Lw). A second one-side gate electrode 242L in a column is connected by a first control line (Lsa) and a second the-other-side gate electrode 242R in a column is connected by a second control line (Lsb).

Figure 18:
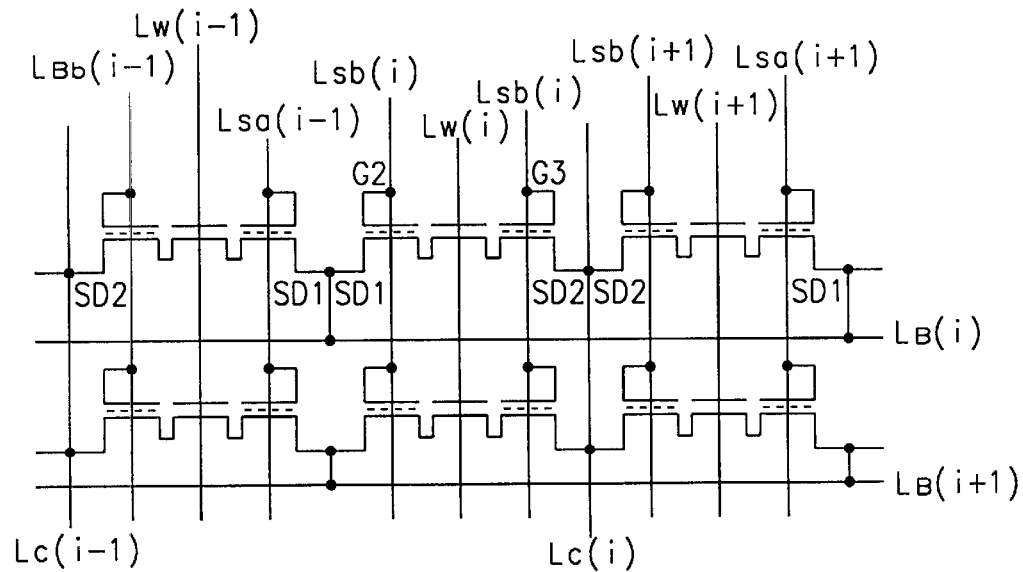
FIG. 18 shows an example of a circuit configuration for a memory array.

In FIG. 18, a source and drain region $SD_1$ (221) at one side in each nonvolatile memory cell in a same row is connected by a bit line (LB). A source and drain region $SD_2$ (222) of memory cells adjacent to the direction of a row in a column is connected and thereof is connected by a common line (Lc). A first gate electrode (G1) 241 in a column is connected by a word line (Lw). A second gate electrode (G2) 242R at one side in a column is connected by a first control line (Lsa) and a second gate electrode (G2) 242R at the other side in a column is connected by a second control line (Lsb).

Provided below are some of the advantages according to the present invention.

(1) A second gate insulator is of a three-layer structure. A carrier injected in a channel forming region is injected getting over a potential barrier between the channel forming region and a first layer of the second gate insulator by being given energy to get over the potential barrier within the length of several time of Lo in a second channel forming region. This enables the thickness of the second gate insulator to be thinner and reduce the potential of the second gate electrode needed when injecting a carrier.

(2) Second gate electrodes and insulator thereof are disposed on both sides of a first gate electrode and the carrier within the channel forming region can be independently injected in each of the second insulators. This results in enabling a memory cell to store two-bit data therein and providing a high integrated density memory.

(3) The carrier injection and extracting thereof to and from the second gate insulator can be conducted only by applying to the second gate electrode a potential whose polarity is the same both for the injection and extraction. This simplifies circuit configuration for the carrier injection and extraction.

While the invention has been particularly shown and described with reference to the preferred embodiments thereof, it will be understood by those skilled in the art that various changes in form and details may be made without departing from the spirit and scope of the invention.

What is claimed is:

1. A nonvolatile memory cell comprising:
   a pair of source and drain regions formed in a main surface of a substrate and separated there between by channel forming semiconductor regions in said main surface of said substrate;
   a first gate insulator formed on a surface of a first channel forming region adjacent to said source region out of said channel forming regions;
   a second gate insulator formed on a surface of a second channel forming region adjacent to said drain region out of said channel forming regions;
   a first gate electrode formed on said first gate insulator; and
   a second gate electrode formed on said second gate insulator, wherein said second gate insulator is at least of a three-layer structure including:
   (a) a first layer forming a potential barrier at the interface with a channel forming region; (b) a third layer forming the potential barrier at the interface with the second gate electrode; and (c) a second layer forming a carrier trapping level at least at one location out of an inside portion of said second layer itself and interfaces with said first and third layers.

2. A nonvolatile memory cell according to claim 1 wherein a carrier injected from said source region to a second channel forming region is injected in the second gate insulator by getting over a potential barrier between said first layer of said second gate insulator and said second channel forming region.

3. A nonvolatile memory cell according to claim 1 and further comprising:
   a first potential feeding means which feeds to said drain region the first potential to supply to said carrier such energy that said carrier may get over the potential barrier formed between said second channel forming region and the first layer of the second gate insulator; and
   a second potential feeding means which feeds to the second gate electrode the potential to form an auxiliary electric field capable of having said carrier which has overcome the potential barrier reached said second layer of the second gate insulator.

4. A nonvolatile memory cell according to claims 1 wherein an insulating material is formed at least on end surfaces of one gate electrode out of said first and second gate electrodes.

5. A nonvolatile memory cell according to claim 4 wherein the insulating material formed on the end surfaces of the one gate electrode is of a side-wall insulating material left anisotropically etching the insulating material formed uniformly on the main surface of the substrate.

6. A nonvolatile memory cell according to claim 4 wherein the insulating material formed on the end surfaces of the one gate electrode is of an oxide film formed by oxidizing said one gate electrode.

7. A nonvolatile memory cell as claimed in claim 1 wherein an insulator is formed to insulate said first gate electrode from second gate electrode each other.

8. A nonvolatile memory cell as claimed in claim 1 wherein said second gate electrode and the second gate insulator thereof are extended to cover a surface and an end surface at the drain side of said first gate electrode.

9. A nonvolatile memory cell as claimed in claim 1 wherein said first gate electrode and the first gate insulator thereof are extended to cover a surface and an end surface at the source side of said second gate electrode.

10. A nonvolatile memory cell as claimed in claim 1 wherein said first and second gate electrodes are mutually insulated by said second gate insulator extended to a gap between said electrodes.

11. A nonvolatile memory cell according to claim 1 wherein carrier tunnel probability of said first layer of said second gate insulator is lower than carrier tunnel probability of said third layer.

12. A nonvolatile memory cell according to claim 1 wherein the carrier tunnel probability of said first layer of said second gate insulator is higher than carrier tunnel probability of said third layer.

13. The method of claim 12 wherein the thickness of said first layer is made thinner than the thickness of said third layer.

14. A nonvolatile memory cell according to claim 1 wherein impurity concentration of the second channel forming region of said channel forming regions is higher than impurity concentration of the first channel forming region.

15. A method of programming a nonvolatile memory cell as claimed in claim 1 wherein:
carrier injection from said second channel forming region to the second gate insulator is conducted by applying a predetermined potential to said drain region so that energy to get over a potential barrier between the second channel forming region and said first layer of said second insulator may be supplied to a carrier and by applying to the second gate electrode the potential to supply an auxiliary electric field to the carrier having overcome said potential barrier, and
carrier extraction from said second gate insulator is conducted by applying to said second gate electrode a potential whose polarity is the same as said potential applied when injecting said carrier therein so that the electric field enabling the carrier to conduct by tunnel-transition across a potential barrier formed between the second layer and the third layer of said second gate insulator may be supplied to said third layer.

16. A nonvolatile memory cell comprising:
a pair of source/drain regions at one side and at the other side formed in a main surface of a substrate and separated therebetween by channel forming semiconductor regions in said main surface of said substrate;
said channel forming semiconductor regions comprising a first channel forming semiconductor region, a second channel forming semiconductor region at one side and a second channel forming semiconductor region at the other side;
a second gate insulator at one side formed on a surface of the second channel forming semiconductor region at one side adjacent to the source/drain region at one side;
a second gate insulator at the other side formed on a surface of the second channel forming semiconductor region at the other side adjacent to the source/drain region at the other side;
said second insulators at one side and the other side being provided with carrier charge trapping means;
a first gate insulator formed on a surface of the first channel forming semiconductor region between each of said second channel forming regions;
a second gate electrode at one side formed on said second gate insulator at one side;
a second gate electrode at the other side formed on said second gate insulator at the other side; and a first gate electrode formed on said first gate insulator.

17. A nonvolatile memory cell according to claim 16 wherein a carrier injected from said source/drain region at one side to the second channel forming region at the other side is injected in the second gate insulator at the other side by getting over a potential barrier between said second gate insulator at the other side and the second channel forming region at the other side.

18. A nonvolatile memory cell according to claim 16 wherein a carrier injected from said source/drain region at the other side to the second channel forming region at one side is injected in said second gate insulator at one side by getting over the potential barrier between said second gate insulator at one side and the second channel forming region at one side.

19. A nonvolatile memory cell according to claim 16 wherein an insulating material is formed at least on end surfaces of one gate electrode out of said first and second gate electrodes.

20. A nonvolatile memory cell according to claim 19 wherein the insulating material formed on the end surface of the one gate electrode is of a side-wall insulating material left by anisotropically etching the insulating layer material which is uniformly formed on the main surface of the substrate.

21. A nonvolatile memory cell according to claim 19 wherein the insulating material formed on the end surface of the one gate electrode is of an oxide film formed by oxidizing said one gate electrode.

22. A nonvolatile memory cell as claimed in claim 16 wherein an insulator is formed to insulate said first gate electrode from second gate electrodes each other.

23. A nonvolatile memory cell as claimed in claim 16 wherein said second gate electrode and gate insulator thereof at one side are extended to cover a surface and end surface of said first gate electrode at one side, and said second gate electrode and gate insulator thereof at the other side are extended to cover a surface and end surface of said first gate electrode at the other side.

24. A nonvolatile memory cell according to claim 16 wherein said first gate electrode and insulator thereof are extended to cover a surface and end surface of each second gate electrode adjacent thereto at one and the other sides.

25. A nonvolatile memory cell according to claim 16 wherein said second gate insulators at one side and the other side are extended to a gap between said first gate electrode and each of second gate electrodes.

26. A nonvolatile memory cell according to claim 16 wherein impurity concentration of each of the second channel forming region in said channel forming regions is higher than impurity concentration of the first channel forming region.

27. A nonvolatile memory cell as claimed in claim 16 wherein said second gate insulators and at one and the other sides are at least of a three-layer structure including: (a) a first layer forming a potential barrier at an interface with one of the second channel forming regions; (b) a third layer forming a potential barrier at the interface with one of the second gate electrodes; and (c) a second layer forming said carrier trapping means at least at one location out of an inside portion of the second layer itself and interfaces with said first and third layers.

28. A nonvolatile memory cell according to claim 27 wherein carrier tunnel probability of said first layer of said second gate insulators is lower than carrier tunnel probability of said third layer.

29. A nonvolatile memory cell according to claim 27 wherein carrier tunnel probability of said first layer of said second gate insulators is higher than carrier tunnel probability of said third layer.

30. The method of claim 29 wherein the thickness of said first layer is made thinner than the thickness of said third layer.

31. A method of programming a nonvolatile memory cell as claimed in claim 27 wherein:
   carrier injection from said second channel forming region at one side to the second gate insulator at one side is conducted by applying a predetermined potential to said source/drain region at one side so that energy to get over a potential barrier between the second channel forming region at one side and said first layer of said second insulator at one side may be supplied to a carrier and by applying to the second gate electrode at one side the potential to supply an auxiliary electric field to the carrier having overcome said potential barrier, and carrier extraction from-said second gate insulator at one side is conducted by applying to said second gate electrode at one side a potential whose polarity is the same as said potential applied when injecting said carrier therein so that the electric field enabling the carrier to perform tunnel-transition across a potential barrier formed between the second layer and the third layer of the second gate insulator at one side may be supplied to said third layer.

32. A method of programming a nonvolatile memory cell as claimed in claim 27 wherein:
   carrier injection from said second channel forming region at the other side to a second gate insulator at the other side is conducted by applying a predetermined potential to said source/drain region at the other side so that energy to get over a potential barrier between the second channel forming region at the other side and the first layer of said second insulator at the other side may be supplied to a carrier and by applying to the second gate electrode the potential to supply an auxiliary electric field to the carrier having overcome said potential barrier, and
   carrier extraction from said second gate insulator at the other side is conducted by applying to said second gate electrode at the other side a potential whose polarity is the same as said potential applied when injecting said carrier therein so that the electric field enabling the carrier to perform tunnel-transition across of a potential barrier formed between the second layer and the third layer of the second gate insulator at the other side may be applied to said third layer.

33. A nonvolatile memory array configured by disposing in the form of a matrix a nonvolatile memory cell as claimed in claim 16 comprising:
   a plurality of bit lines (LB) each one of which commonly connects in the direction of a column each of the source/drain regions of a pair of nonvolatile memory cells adjacent to the direction of a row;
   a plurality of word lines (Lw) each one of which connects each of the first gate electrodes of the nonvolatile memory cells disposed on a same row,
   a plurality of first control lines (Lsa) each one of which connects each of the second gate electrodes at one side of the nonvolatile memory cells disposed on a same column; and
   a plurality of second control lines (Lsb) each one of which connects each of the second gate electrodes at the other side of the nonvolatile memory cells disposed on a same column.

34. A non-volatile memory array according to claim 33 wherein both ends of said first gate electrode and an insulator are formed to cover at least end portion and end surface of each of said second gate electrodes at one side and at the other side and wherein said first gate electrodes of adjacent cells are interconnected across said source/drain region to make said word line.

35. A non-volatile memory array according to claim 34 wherein a side wall insulator is provided on an end surface of said first gate electrode.

36. A non-volatile memory array according to claim 33 wherein said first gate electrode is common with said word line (Lw) and further is extended over said second gate electrodes and insulated by an insulator formed on a surface of each of said second gate electrodes and by a side-wall insulator on a side surface of each of said second gate electrodes.

37. A non-volatile memory array according to claim 33 wherein:
   said second gate insulator is extended to a gap between said first gate electrode and said second gate electrodes;
   said second gate electrodes at one and the other sides of said first gate electrodes are formed as a pair of side-walls on said second gate insulator; and
   said word line (Lw) over said second gate electrodes is connected to an upper portion of said first gate electrode.

38. A non-volatile memory array according to claim 37 wherein an oxide film on an end surface of said first gate electrode is provided by oxidizing said first gate electrode.

39. A nonvolatile memory array configured by disposing in the form of a matrix the nonvolatile memory cells as claimed in claim 16 comprising:
   a plurality of common lines (Lc) each one of which commonly connects in the direction of a column each of the source/drain regions at one side of a pair of nonvolatile memory cells adjacent to the direction of a row;
   a plurality of bit lines (LB) each one of which connects each of the source/drain regions at the other side of the nonvolatile memory cells disposed on a same row;
   a plurality of word lines (Lw) each one of which connects each of the first gate electrodes of the nonvolatile memory cells disposed on a same column,
   a plurality of first control lines (Lsa) each one of which connects each of the second gate electrodes at one side of the nonvolatile memory cells disposed on a same column; and
   a plurality of second control lines (Lsb) each one of which connects each of the second gate electrodes at the other side of the nonvolatile memory cells dispose on a same column.

40. A nonvolatile cell according to claim 16 wherein said second gate insulator is extended into a gap between said first gate electrode and said second gate electrodes and wherein said second gate electrodes at one said and at the other side of said first gate electrode are formed as a pair of side-walls on said second gate insulator.

41. A nonvolatile cell according to claim 16 wherein impurity concentration of said second channel forming regions is more than 4E17 atom/cm$^3$.

42. A method of programming a nonvolatile memory cell as claimed in claim 16 wherein carrier injection from said second channel forming region at one side to a second gate insulator at one side is conducted by applying a predetermined potential to said source/drain region at one side so that energy to get over a potential barrier between said second channel forming region at one side and the first layer (132*a*) of said second insulator at one side can be supplied to a carrier and by applying to said second gate electrode at one side the potential to supply an auxiliary electric field to the carrier having overcome said potential barrier, and carrier injection from said second channel forming region at the other side to a second gate insulator at the other side is conducted by applying a predetermined potential to said source/drain region at the other side so that energy to get over a potential barrier between the second channel forming region at the other side and the first layer (132*a*) of said second insulator at the other side may be supplied to a carrier and by applying to said second gate electrode the potential to supply an auxiliary electric field to the carrier having overcome said potential barrier, resulting in two-bit data storage in one cell.

43. A nonvolatile memory array configured by disposing in the form of a matrix a nonvolatile memory cell said nonvolatile memory cell comprising:

a pair of source and drain regions formed in a main surface of a substrate and separated there between by channel forming semiconductor regions in said main surface of said substrate;

a first gate insulator formed on a surface of a first channel forming region adjacent to said source region out of said channel forming regions;

a second gate insulator formed on a surface of a second channel forming region adjacent to said drain region out of said channel forming regions;

a first gate electrode formed on said first gate insulator; and a second gate electrode formed on said second gate insulator, wherein said second gate insulator is at least of a three-layer structure including:

(a) a first layer forming a potential barrier at the interface with a channel forming region; (b) a third layer forming the potential barrier at the interface with the second gate electrode; and (c) a second layer forming a carrier trapping level at least at one location out of an inside portion of said second layer itself and interfaces with said first and third layers;

said nonvolatile memory array comprising:

a plurality of bit lines (L$_B$) each one of which connects each of the source regions of the nonvolatile memory cells disposed on a same row;

a plurality of common lines (L$_C$) each one of which commonly connects in the direction of column each of the drain regions of a pair of nonvolatile memory cells adjacent to the direction of a row;

a plurality of control lines (L$_S$) each one of which connects each of the second gate electrodes in the nonvolatile memory cells disposed on a same column; and a plurality of word lines (L$_W$) each one of which connects each of the first gate electrodes of the nonvolatile memory cells disposed on a same column.

44. A method of programming a nonvolatile memory array according to claim 31, said method comprising:

applying to a selected said word line (L$_W$) a first potential (V$_{WPr1}$) which is higher than the gate threshold voltage (Vth1) of said first gate electrode (141);

applying to a selected said common line (L$_C$) a second potential which is higher than said potential barrier voltage;

applying to a selected said control line (L$_S$) a third potential which is higher than said potential barrier voltage minus work function difference in voltage between said second gate electrode and said second channel forming region; and applying in advance to a selected said bit line (L$_B$) a predetermined potential (V$_{BPr}$) which is higher than the value (V$_{WPr1}$−Vth1) obtained by subtracting the threshold voltage (Vth1) from said first potential (V$_{WPr1}$), then when programming, a fourth potential (V$_{BPr1}$) which is higher than the difference value (V$_{WPr1}$−Vth1) or a fifth potential (V$_{BPr0}$) which is lower than the difference value (V$_{WPr1}$−Vth1) being applied to said bit line depending on the content of the data stored.

45. A method of programming a nonvolatile memory array according to claim 44 further comprising:

said fifth value being selected out of multi-value depending on the level of the data stored resulting in multi-value data storage.

46. A method of reading a nonvolatile memory array according to claim 43, said method comprising:

applying a first read potential (V$_{BRD}$) to selected said bit line (L$_B$);

applying to the control line (L$_C$) a second read potential (V$_{CRD}$) which is higher than the smaller value out of the programmed gate threshold voltage (Vth2) of said second gate electrode; and applying to the word line (L$_W$) a third read potential (V$_{WRD}$) which is higher than the gate threshold voltage (Vth1) of said first gate electrode.

47. A method of reading a nonvolatile memory array according to claim 43, said method comprising:

applying a first read potential (V$_{BRD}$) to selected said bit line (L$_B$);

applying to the control line (L$_S$) a second read potential (V$_{CRD}$) which is higher than the smaller value out of the programmed gate threshold voltage (Vth2) of said second gate electrode; and applying to the word line (L$_W$) a third read potential (V$_{WRD}$) which is higher than the gate threshold voltage (Vth1) of said first gate electrode.

48. A nonvolatile memory array configured by disposing in the form of a matrix the nonvolatile memory cells as claimed in claim 1 comprising:

a plurality of bit lines (L$_B$) each one of which connects each of the source regions of the nonvolatile memory cells disposed on a same row;

a plurality of common lines (Lc) each one of which commonly connects in the direction of a column each of the drain regions of a pair of nonvolatile memory cells adjacent to the direction of a row;

a plurality of control lines (Ls) each one of which connects each of the second gate electrodes of the nonvolatile memory cells disposed on a same row; and a plurality of word lines (Lw) each one of which connects each of the first gate electrodes of the nonvolatile memory cells disposed on a same column.

49. A method of programming a nonvolatile memory array according to claim 48, said method comprising:

applying to a selected said word line (Lw) a first potential ($V_{Wpr1}$) which is higher than the gate threshold voltage ($V_{th1}$) of said first gate electrode;

applying to a selected said common line (Lc) a second potential which is higher than said potential barrier voltage;

applying to a selected said control line (Ls) a third potential which is higher than said potential barrier voltage minus work function difference in voltage between said second gate electrode and said second channel forming region; and applying in advance to a selected said bit line (LB) a predetermined potential ($V_{BPr}$) which is higher than the value ($V_{Wpri}-V_{th1}$) obtained by subtracting the threshold voltage ($V_{th1}$) from said first potential ($V_{Wpr1}$), then when programmning, a fourth potential ($V_{BPr1}$) which is higher than the difference value ($V_{Wpri}-V_{th1}$) or a fifth potential ($V_{BPr0}$) which is lower than the difference value ($V_{Wpr1}-V_{th1}$) being applied to said bit line depending on the content of the data stored.

50. A method of programming a nonvolatile memory array according to claim 49 further comprising:

said fifth value being selected out of multi-value depending on the level of the data stored, resulting multi-value data storage.

51. A nonvolatile memory array configured by disposing in the form of a matrix the nonvolatile memory cells as claimed in claim 1 comprising:

a plurality of bit lines (LB) each one of which connects each of the drain regions of the nonvolatile memory cells disposed on a same row;

a plurality of common lines (Lc) each one of which commonly connects in the direction of a column each of the source regions of a pair of nonvolatile memory cells adjacent to the direction of a row;

a plurality of control lines (Ls) each one of which connects each of the second gate electrodes of the nonvolatile memory cells disposed on a same row; and a plurality of word lines (Lw) each one of which connects each of the first gate electrodes of the nonvolatile memory cells disposed on a same row.

52. A nonvolatile memory array configured by disposing in the form of a matrix nonvolatile memory cells said nonvolatile memory cell comprising:

a pair of source and drain regions formed in a main surface of a substrate and separated there between by channel forming semiconductor regions in said main surface of said substrate;

a first gate insulator formed on a surface of a first channel forming region adjacent to said source region out of said channel forming regions;

a second gate insulator formed on a surface of a second channel forming region adjacent to said drain region out of said channel forming regions;

a first gate electrode formed on said first gate insulator; and a second gate electrode formed on said second gate insulator, wherein said second gate insulator is at least of a three-layer structure including:

(a) a first layer forming a potential barrier at the interface with a channel forming region; (b) a third layer forming the potential barrier at the interface with the second gate electrode; and (c) a second layer forming a carrier trapping level at least at one location out of an inside portion of said second layer itself and interfaces with said first and third layers;

said nonvolatile memory array comprising:

a plurality of bit lines (LB) each one of which connects each of the drain regions of the nonvolatile memory cell disposed on a same row;

a plurality of common lines (Lc) each one of which commonly connects in the direction of a column each of the source regions of a pair of nonvolatile memory cells adjacent to the direction of a row;

a plurality of control lines (Ls) each one of which connects each of the second gate electrodes of the nonvolatile memory cells disposed on a same row; and a plurality of word lines (Lw) each one of which connects each of the first gate electrodes of the nonvolatile memory cells disposed on a same column.

* * * * *